US009600104B2

(12) United States Patent
Bayramoglu et al.

(10) Patent No.: US 9,600,104 B2
(45) Date of Patent: Mar. 21, 2017

(54) TOUCH DEVICE AND A DETECTION METHOD THEREOF

(71) Applicant: TPK TOUCH SOLUTIONS (XIAMEN) INC., Xiamen (CN)

(72) Inventors: Gokalp Bayramoglu, Xiamen (CN); Yanru Wang, Nan'an (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 247 days.

(21) Appl. No.: 13/920,099

(22) Filed: Jun. 18, 2013

(65) Prior Publication Data
US 2013/0335371 A1    Dec. 19, 2013

(30) Foreign Application Priority Data
Jun. 18, 2012  (CN) .......................... 2012 1 0202714

(51) Int. Cl.
G06F 3/045    (2006.01)
G06F 3/041    (2006.01)
H03K 17/96    (2006.01)

(52) U.S. Cl.
CPC ............ G06F 3/041 (2013.01); G06F 3/0414 (2013.01); H03K 17/9643 (2013.01)

(58) Field of Classification Search
CPC ................ G06F 2203/041–2203/04113; G06F 3/041–3/047
See application file for complete search history.

(56) References Cited

U.S. PATENT DOCUMENTS

| | | | |
|---|---|---|---|
| 2004/0263483 A1* | 12/2004 | Aufderheide ....... | G06F 3/03545 345/173 |
| 2008/0179112 A1* | 7/2008 | Qin et al. ................... | 178/18.06 |
| 2009/0002199 A1 | 1/2009 | Lainonen et al. | |
| 2010/0013797 A1* | 1/2010 | Kim et al. ..................... | 345/176 |
| 2011/0043477 A1 | 2/2011 | Park et al. | |
| 2011/0063239 A1* | 3/2011 | Xie et al. ....................... | 345/173 |
| 2013/0257744 A1* | 10/2013 | Daghigh et al. ............... | 345/173 |

FOREIGN PATENT DOCUMENTS

TW     201017496     5/2010

* cited by examiner

Primary Examiner — Matthew Sim
(74) Attorney, Agent, or Firm — Cooper Legal Group, LLC (57) ABSTRACT

A touch device is provided in the present disclosure. The touch device comprises a plurality of piezoelectric transducers arranged in a touch region of a substrate and a plurality of signal wires located on the substrate and electrically connecting the plurality of piezoelectric transducers. The touch device in the present disclosure can convert mechanical vibration into an electrical signal such that the signal on the touch device can be detected without using any additional driving voltage.

20 Claims, 9 Drawing Sheets

TOUCH DEVICE AND A DETECTION METHOD THEREOF

BACKGROUND OF THE INVENTION

This Application claims the benefit of the People's Republic of China Application NO. 201210202714.1, filed on Jun. 18, 2012.

TECHNICAL FIELD

The present disclosure relates to a touch device and a touch detection method thereof. More particularly, the present disclosure relates to a piezoelectric touch device that detects either a single touch location or multiple touch locations by using a plurality of piezoelectric transducers that are arranged on a substrate.

DESCRIPTION OF THE RELATED ART

Electronic products in the current market are designed with the aim of being light in weight and thin in thickness. Thus, many electronic products no longer utilize keyboards as input devices because keyboards occupy a large space. As a result, touch devices are constantly replacing keyboards as input devices and providing a better way to input information into these products. Therefore, touch devices are widely used in various electronic products such as mobile phones, personal digital assistants (PDA) and global positioning systems (GPS).

Currently, capacitive touch panels and resistive touch panels are the two main types of touch panels used in the touch devices. However, the capacitive touch panels and resistive touch panels both require to acquire a driving voltage for detecting if touch points happened or not.

Generally, a resistive touch panel requires two substrates (namely, a top substrate and a bottom substrate) formed with conductive layers respectively. The two conductive layers contact to each other when the top substrate is pressed for touching. A change in current and voltage is detected by a control circuit to determine the location of the touch point. However, the top substrate in the resistive touch panel tends to get deformed over time due to an object such as a human finger pressing the top substrate downward very often. Furthermore, the resistive touch panel can only detect one touch point. On the other hand, the capacitive touch panels normally do not have any defects that exist in the resistive touch panels. A capacitive touch panel can identify a touch point by detecting a change of capacitance between the object and the touch surface of the capacitive touch panel, wherein the object has to be a conductor. If the object is an insulator then the capacitive touch panel cannot detect the object and therefore the touch point is also not detected.

Therefore, there is a need to develop a touch device that does not need a driving voltage to detect multiple touch points of a conductive or an insulative object and does not get deformed over time.

SUMMARY OF THE DISCLOSURE

The present disclosure provides a touch device that integrates piezoelectric material with a touch module, namely, directly forming piezoelectric transducers with positioning ability into the touch module to detect multiple touch points of a conductive or an insulative object without a driving voltage.

In order to achieve the above purpose, the present disclosure provides a touch device, wherein the touch device comprises a plurality of piezoelectric transducers arranged in a touch region of a substrate and a plurality of signal wires located on the substrate and electrically connecting the plurality of piezoelectric transducers.

The present disclosure further provides a touch detection method for a touch device, comprising the following steps of:
  detecting an output signal of a piezoelectric transducer, wherein the output signal is converted from mechanical vibration;
  determining if there is a touch point on the piezoelectric transducers according to the output signal; and
  calculating coordinate of the piezoelectric transducer according to the output signal through a calculation procedure.

Features of the touch device provided in the present disclosure lie in that the touch device has a plurality of piezoelectric transducers arranged on a substrate, which can directly determine location of the touch point on the touch device; moreover, the touch device can convert mechanical energy into an electrical signal such that the signal on the touch device can be detected without additional driving voltage, thereby providing an energy-saving touch panel.

BRIEF DESCRIPTION OF THE DRAWINGS

For those skilled in the art to understand the present disclosure, numerous embodiments are described below, annexing drawings to minutely illustrate the matters of the disclosure and the purpose thereof.

DETAILED DESCRIPTION OF THE EMBODIMENTS

Specific components are indicated by certain terms in the present description and following claims. It is comprehensible to those skilled in the art that a manufacturer may use different teens to indicate same components. The present description and following claims are not intended to use the difference of terms as a way to distinguish components, but use the functional difference of components as distinguishing benchmark. Term "include" referred in the complete description and following claims is an open expression, and is explained as "including but not limited to", and is not described herein again.

Figure 1:
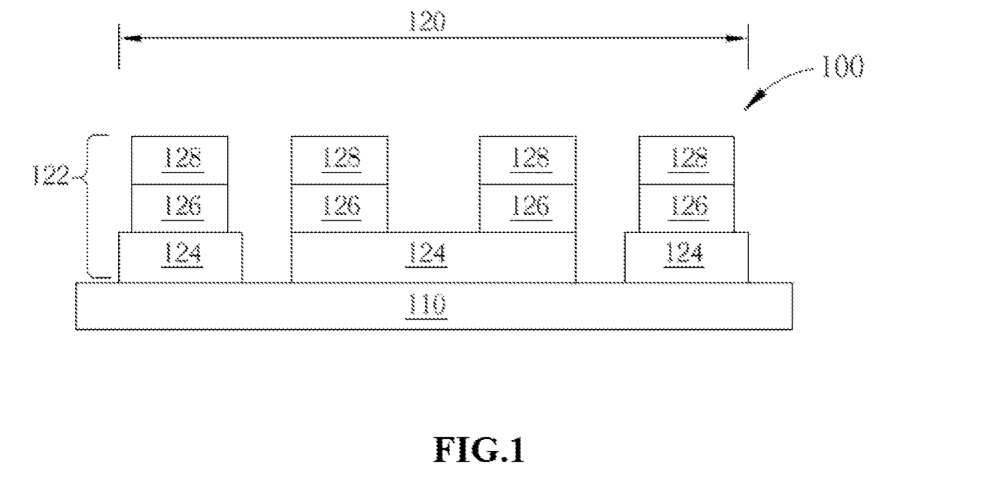
FIG. 1 is a schematic sectional view of a touch device in accordance with a first embodiment of the present disclosure.

FIG. 1 is a schematic sectional view of a touch device in accordance with a first preferred embodiment of the present disclosure. Referring to FIG. 1, a touch device 100 comprises a substrate 110, which can be a planar substrate or a non-planar substrate made of glass or flexible transparent material. The substrate 110 has at least one touch region 120. A patterned common layer 124 is formed on the touch region 120 of the substrate 110, and then a patterned piezoelectric material layer 126 and a patterned signal layer 128 are formed on the common layer 124, wherein the signal layer 128 comprises a plurality of electrodes which are separated from each other. Wherein each of the electrodes is electrically connected with a signal wire (not shown) respectively, and the piezoelectric material layer 126 comprises a plurality of piezoelectric blocks which are separated from each other, thereby forming a plurality of piezoelectric transducers 122. In other words, there are a plurality of piezoelectric transducers 122 in the touch region 120, and each piezoelectric transducer 122 is composed of a common layer 124, an piezoelectric block and an electrode. The piezoelectric material layer 126 is located between the common layer 124 and the signal layer 128.

According to an embodiment, when the touch device of the present disclosure is used as a touch panel, the common layer 124 and the signal layer 28 are made of transparent conductive materials, such as one or more of indium tin oxide (ITO), indium zinc oxide (IZO), cadmium tin oxide (CTO), aluminum zinc oxide (AZO), indium tin zinc oxide (ITZO), tin oxide, zinc oxide, cadmium oxide, hafnium oxide (HfO), indium gallium zinc oxide (InGaZnO), indium gallium zinc magnesium oxide (InGaZnMgO), indium gallium magnesium oxide (InGaMgO), indium gallium aluminum oxide (InGaAlO), Carbon Nano Tube (CNT), Silver Carbon Nano Tube or Copper Carbon Nano Tube, or other transparent conductive materials and composition of metal or non-metal. The piezoelectric material layer 126 can be made of monocrystalline material, polymer material, thin film material, ceramic material or composite material, such as one or more of zinc oxide (ZnO), lead zirconate titanate (PZT), lead lanthanum zirconate titanate (PLZT), barium titanate (BaTiO$_3$), polyvinylidene fluoride (PVDF), polyvinyl fluoride (PVF), polyvinylchloride (PVC) or quartz, but it is not limited thereto. Moreover, when the present disclosure is applied in a non-display touch module, material of the signal layer 128 is not limited to transparent conductive materials, but can also include any other appropriate metal such as one or more of Silver (Ag), Copper (Cu), Aurum (Au), aluminum (Al), Molybdenum (Mo), Wolfram (W), Nickel (Ni), Ferrum (Fe), Platinum (Pt), Tin (Sn) and Lead (Pb) or alloy such as Silver-copper, cadmium, copper, chromium, copper, beryllium copper, zirconium copper, silicon aluminum-magnesium, aluminum-magnesium, aluminum magnesium iron, and aluminum zirconium, but not limited thereto. The above-mentioned transparent conductive materials, metal, alloy and piezoelectric material can be different according to practical requirements, and thus they are not limited by the present disclosure.

A plurality of signal wires 136 can then be formed on the substrate 110. Each signal wire 136 is electrically connected with the piezoelectric transducer 122, wherein one end of each signal wire 136 is electrically connected to each signal layer 128 while the other end of the signal wire 136 is electrically connected with a microprocessor (not shown) outside the touch region 120. In addition, another feature of the present embodiment is that the common layer 124 may be a patterned graph and a sidewall of the common layer 124 adjacent to the signal wire 136 is flush with the sidewalls of the piezoelectric material layer 126 and the signal layer 128 by utilizing a patterning technique. The purpose of using patterning technique is to insulate the signal wires 136 from the corresponding common layer 124, thereby avoiding mutual conduction and interference.

Figure 2:
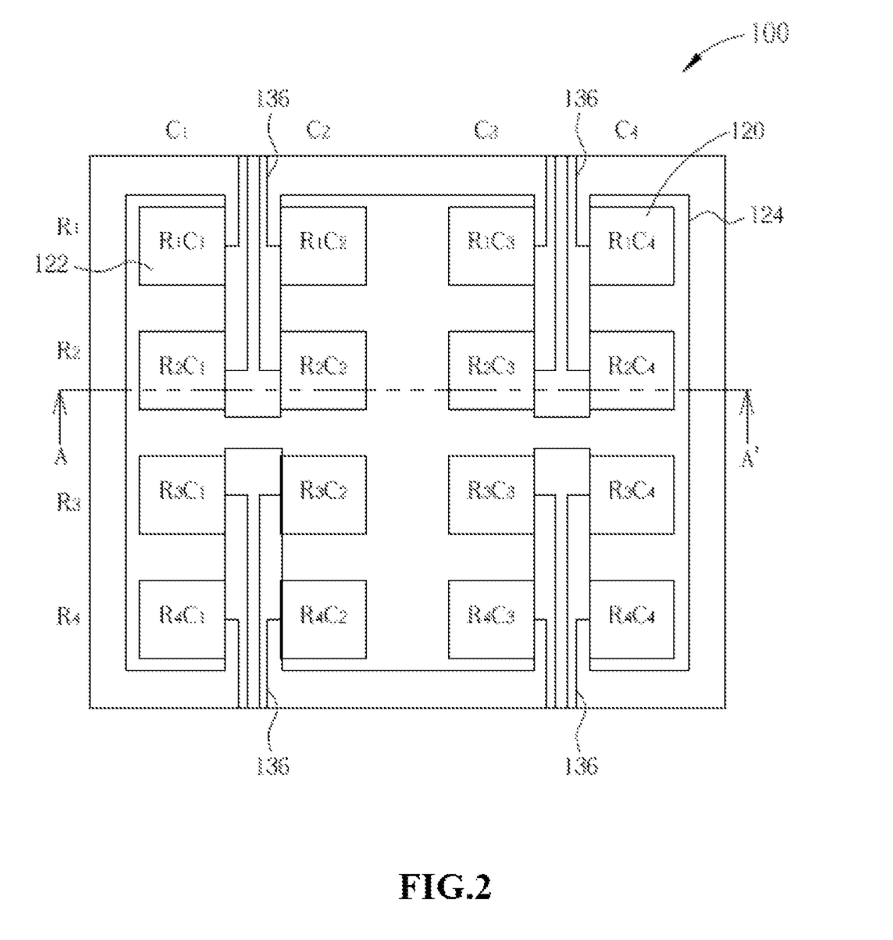
FIG. 2 is a schematic top view of the touch device in accordance with the first embodiment of the present disclosure.

A touch detection method of the touch device is provided herein. For a clearer description, the piezoelectric transducers 122 in the touch region 120 are numbered according to their position arrangement, such as R1C1, R1C2, R2C2, etc. When a user touches the surface of the touch device 100, an external force (not shown) is generated and as a result, the substrate mechanically vibrates. This mechanical vibration is detected by the piezoelectric transducers 122. Each piezoelectric transducer 122 converts the mechanical vibration into an electrical signal and then output the electrical signal as an output signal. The piezoelectric transducers 122 can generate electrical signals by themselves without a help from an additional driving voltage. The external microprocessor detects the output signal and determines if there is a touch point on the touch device according to the output signal, moreover, the external microprocessor determines if the output signal that has an electrical change is caused by touching the touch device or caused by noise. Then, coordinates of the piezoelectric transducer 122 that has converted the mechanical energy to electrical energy are calculated so as to output the coordinates of the touch location on the touch device to the system, thereby achieving the effect of positioning. More specifically, since each piezoelectric transducer 122 is composed of a common layer 124, a piezoelectric material layer 126, and a signal layer 128, wherein the common layer 124 is grounded or connected to a reference voltage such that when the piezoelectric transducer 122 is touched, a potential difference is generated between the common layer 124 and the signal layer 128 to form the output signal, and then the output signal is transmitted to the microprocessor via the signal wire 136 connected with the signal layer 128.

If the touch region of the substrate 110 is large such that several output signals are transmitted to the microprocessor at a time, the microprocessor can define the coordinates of piezoelectric transducers 122 that transmit the output signals, and calculate barycentric coordinate of the touch point according to the coordinates of the piezoelectric transducers 122 and the output signal, and then calculate the distance between the coordinate of each piezoelectric transducer 122 and the barycentric coordinate, thereby determining which piezoelectric transducer 122 has generated the output signal based on the shortest distance between the coordinate of the piezoelectric transducers 122 and the barycentric coordinate. Namely, the one that has the shortest distance from the barycentric coordinate is the touch point. For example, output signals sent out by nine piezoelectric transducers 122 are detected by the external microprocessor; each of the output signals sent out by the piezoelectric transducer 122 is defined as Ui and each of the coordinates of the piezoelectric transducers 122 is defined as (Xi, Yi); then, the barycentric coordinate of these nine piezoelectric transducers 122 is:

$$X = \frac{\sum_1^9 X_i * U_i}{\sum_1^9 U_i}, Y = \frac{\sum_1^9 Y_i * U_i}{\sum_1^9 U_i}$$

Distance between each piezoelectric transducer 122 and the barycentric coordinate is calculated as:

$$D_i \sqrt{(X-X_i)^2+(Y-Y_i)^2}$$

If the distance Di is the shortest one, the piezoelectric transducer 122 at point i is determined as the touch point, and thus the coordinate of the touch point can be determined.

Another method can also be adopted to determine coordinate of a touch point By analyzing and comparing values of the output signals received, the piezoelectric transducer 122 that generates the output signal with the largest value is determined as the piezoelectric transducer 122 being touched; correspondingly, the coordinate of the piezoelectric transducer 122 is determined as the touch point. For example, when a user touches the piezoelectric transducer 122 which is numbered as R2C2, other piezoelectric transducers 122 around R2C2, such as R2C1, R2C3, R1C2, etc., may also transmit output signals with different values to the microprocessor. But in the process of the piezoelectric material layer 126 converting mechanical energy into electrical energy, the external force received by the touch point is larger, and therefore the output signal transmitted by R2C2 is larger than the output signals transmitted by other piezoelectric transducers around it. Thus, the microprocessor can automatically determine R2C2 as the piezoelectric transducer 122 being touched.

Figure 3:
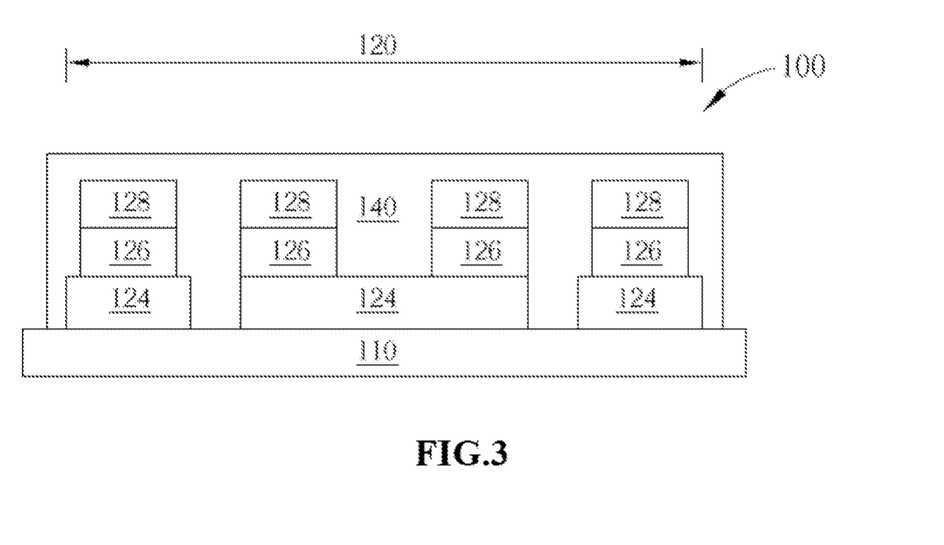
FIG. 3 is a schematic sectional view of the touch device in accordance with the first embodiment of the present disclosure.

Referring to FIG. 3, the touch device 100 further comprises a protection layer 140 covering the plurality of piezoelectric transducers 122, the protection layer 140 is overlaid on the piezoelectric transducers 122 to isolate the elements, thereby avoiding them from being damaged due to a chemical change or a physical effect. FIG. 3 is a sectional view of the touch device along the section line A-A' shown in FIG. 2. The protection layer 140 can be made of an inorganic material such as silicon nitride, silicon oxide or silicon oxynitride, or made of an organic material such as acrylic resin or other proper materials, but not limited thereto.

It should be noted that the method for forming the patterned material layers in the present disclosure, such as the common layer 124, the piezoelectric material layer 126, the signal layer 128 or the signal wire 136, includes DC sputtering, RF sputtering, reactive sputtering, magnetrons sputtering, ion plasma sputtering, pulsed laser deposition, chemical vapor deposition, sol-gel, molecular beam expitaxy or spray pyrolysis, but not limited thereto. Other proper methods can also be used according to the process requirements.

Different embodiments of the present disclosure are described below. The description is simplified, focusing on the differences between the embodiments but not repeating the similarities. Besides, in order to make it convenient to compare the embodiments with one another, same elements of the embodiments are marked with the same symbols.

Figure 4:
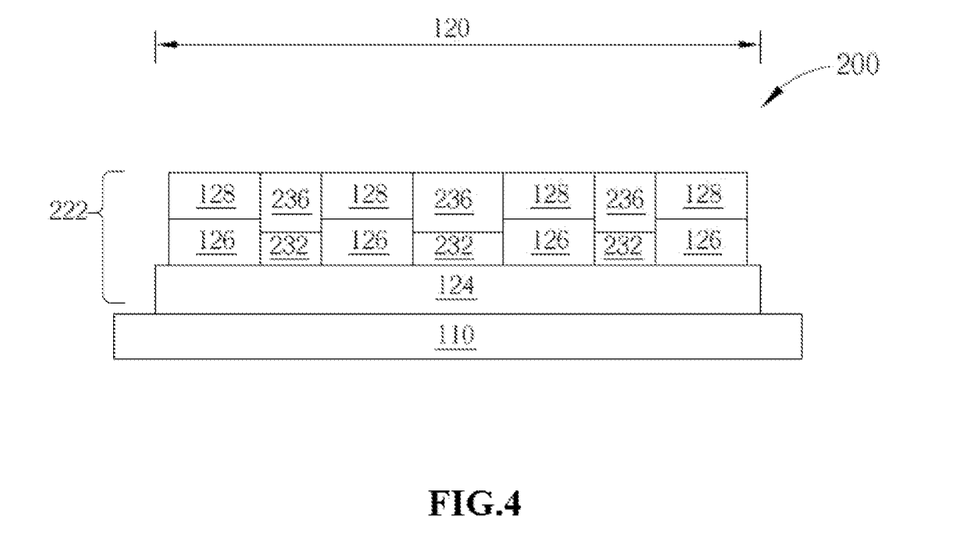
FIG. 4 is a schematic sectional view of a touch device in accordance with a second embodiment of the present disclosure.
Figure 5:
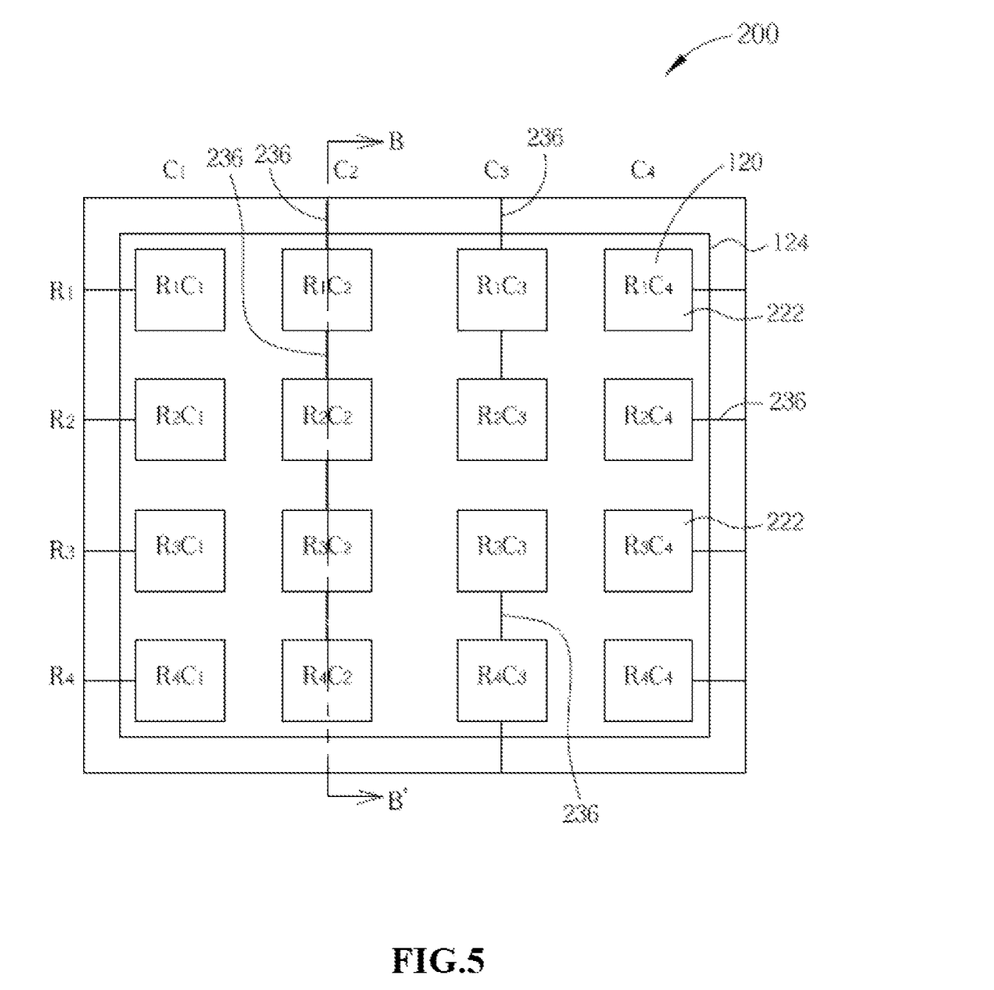
FIG. 5 is a schematic top view of the touch device in accordance with the second embodiment of the present disclosure.
Figure 6:
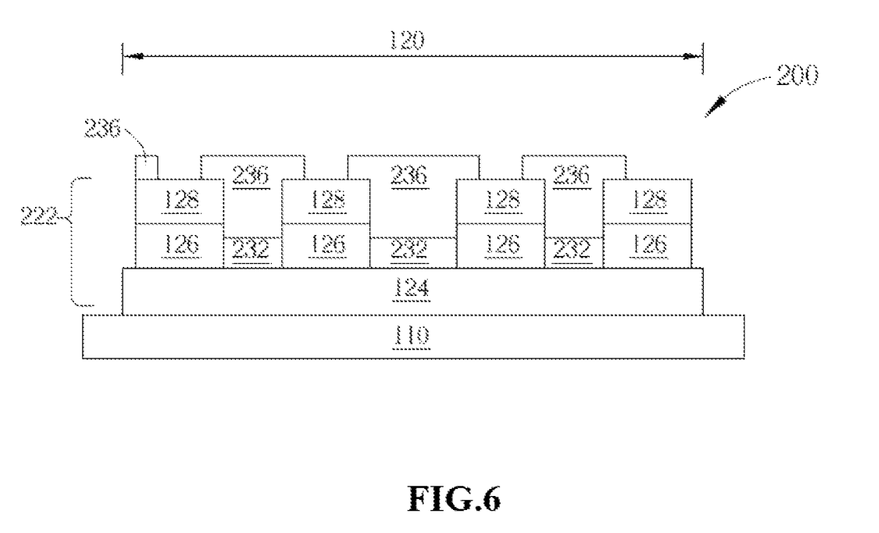
FIG. 6 is a schematic sectional view of a touch device in accordance with another mode of the second embodiment of the present disclosure.
Figure 7:
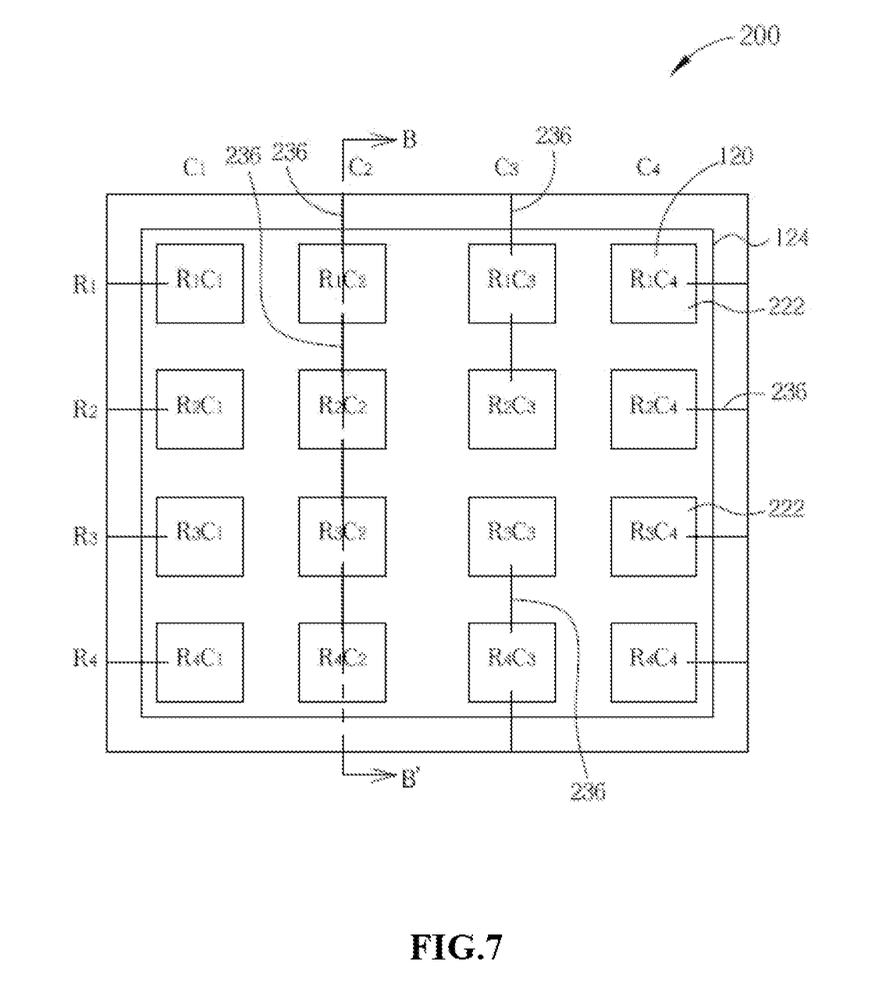
FIG. 7 is a schematic top view of the touch device in accordance with another mode of the second embodiment of the present disclosure.

FIG. 4 is a schematic sectional view of a touch device in accordance with a second embodiment of the present disclosure. It is a sectional view along a sectional line B-B' shown in FIG. 5. A touch device 200 has a substrate 110, on which at least a touch region 120 is defined. After forming a common layer 124 on the touch region 120 of the substrate 110, a patterned piezoelectric material layer 126 and a signal layer 128 are formed on the common layer 124 in succession. The common layer 124, the piezoelectric material layer 126, and the signal layer 128 form a plurality of piezoelectric transducers 222. An insulation element 232 is formed on the common layer 124 which is other than the place the patterned piezoelectric material layer 126 and the signal layer 128 are formed on and the insulation element 232 is located between the piezoelectric transducers 222 horizontally. Then, a plurality of signal wires 236 are formed on the insulation element 232 in vertical direction and located between the signal layers 128 in horizontal direction. After electrically connecting the signal layers 128 with a microprocessor (not shown) outside the touch region 120 by the signal wires 236, a protection layer (not shown) is additionally formed to cover and protect the elements that are formed on the substrate 110. Difference between the present embodiment and the previous embodiment lies in that: the signal wires 236 not only connect the signal layers 128 with the microprocessor outside the touch region 120, but also make the plurality of signal layers 128 mutually connected. In other words, the signal layer 128 comprises a plurality of electrodes, and each of the signal wires 236 is electrically connected with one part of the electrodes, but it should be noted that, there still exist the other part of the electrodes separating themselves from each other and not electrically connected by the signal wires 236. For example, as shown in FIG. 5, the piezoelectric transducers 222 (R1C2, R2C2, R3C2 and R4C2) located in the second column (C2) are serially connected by the signal wires 236. But the connection mode of the present embodiment is not limited to whole row or whole column connection. For example, the piezoelectric transducers 222 in the third column (C3) are connected pair by pair. Comparing with the previous embodiment, the present embodiment can reduce the quantity of the signal wires 236 and reduce the quantity of signals processed by the microprocessor at the same time. For example, when a user touches any one of the four piezoelectric transducers 222 (R1C2, R2C2, R3C2 and R4C2) in second column C2, electrical signals would be transmitted to the microprocessor through a same signal wire, or when a user touches any one of R1C3 and R2C3 as shown in FIG. 5, only a group of electrical signals are transmitted to the microprocessor. For the microprocessor, if the quantity of electrical signals to be processed is reduced, the overall calculation speed can be improved. This structure design can be applied to user interfaces symbolizing a large button. When the serially connected piezoelectric transducers 222 are touched, signals generated by the serially connected piezoelectric transducers 222 are output via the same column of signal wires 236, values of the signals generated by touching the piezoelectric transducers 222 on the different location are different such that the microprocessor can determine a specific touch location according to the values of the output signals. Moreover, if the quantity of the signal wires 236 is reduced, the process cost can also be reduced. In addition, in the present embodiment, disposition of the signal wires 236 is not limited to the above-mentioned. The signal wires 236 can also be disposed as shown in FIG. 6 and FIG. 7. FIG. 6 and FIG. 7 respectively are a sectional view and a top view of a touch device in accordance with another mode of the second preferred embodiment of the present disclosure. Difference of this mode mainly lies in that the signal wires 236 are not only located between the piezoelectric transducers 222 in horizontal direction but also partially located on the signal layer 128 in vertical direction, thereby better stabilizing the ability of the electrical connection between the signal wires 236 and the piezoelectric transducers 222 so as to avoid the situation that the signal wires 236 and the piezoelectric transducers 222 are disconnected. In the second embodiment of the present disclosure, besides a part of the piezoelectric transducers 222 which are mutually connected by the signal wires 236, there is another part of the piezoelectric transducers 222, which are directly connected to the external microprocessor via the signal wires 236 but not mutually connected.

Figure 8:
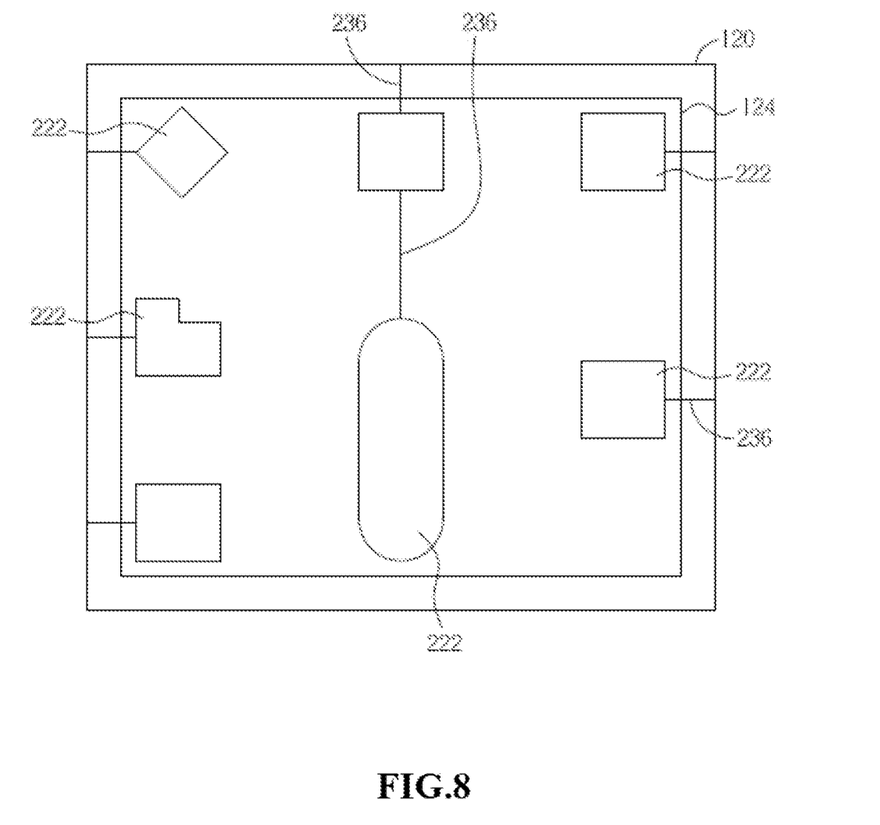
FIG. 8 shows a touch device in accordance with another mode of the second embodiment of the present disclosure.

It should be noted that in the embodiments of the present disclosure, each of the piezoelectric transducers 222 comprises a common layer 124, a piezoelectric material layer 126, and a signal layer 128, but the present disclosure does not limit areas and shapes of the piezoelectric transducers 222, as shown in FIG. 8. FIG. 8 shows a touch device in accordance with another mode of the second preferred embodiment of the present disclosure. A plurality of piezoelectric transducers 222 are arranged in a touch region 120. Areas of the piezoelectric transducers 222 can be the same or different, which is not limited by the present disclosure. Shapes of the piezoelectric transducers 222 are not limited to rectangles but can be of any shapes. Additionally, the arrangement of the piezoelectric transducers 222 can be a random arrangement as shown in FIG. 8. In the present embodiment, the signal layer 128 comprises a plurality of electrodes with certain pattern, areas, shapes, and arrangement mode thereof that can he changed according to users' design requirements.

Figure 9:
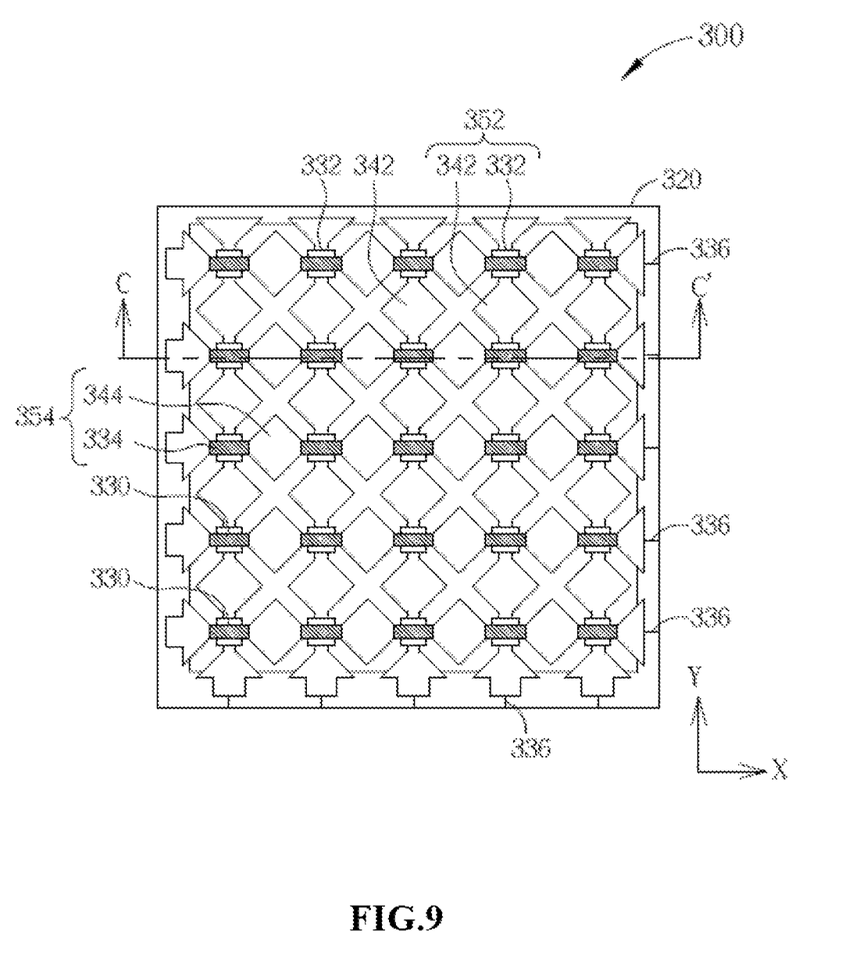
FIG. 9 is a schematic top view of a touch device in accordance with a third embodiment of the present disclosure.
Figure 10:
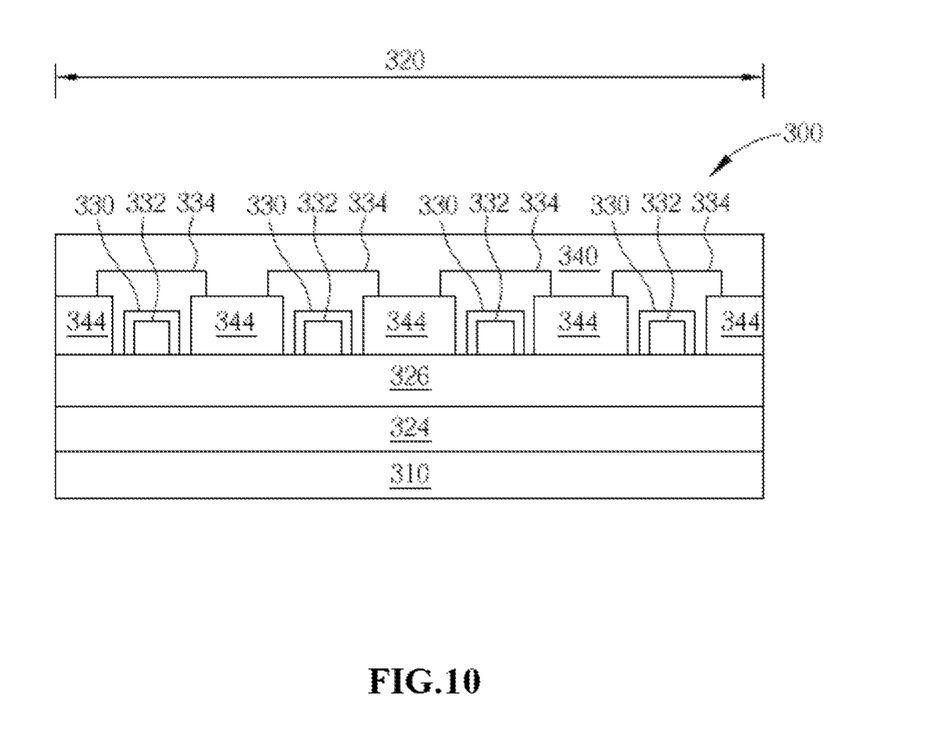
FIG. 10 is a schematic sectional view of the touch device in accordance with the third embodiment of the present disclosure.

Referring to FIG. 9 and FIG. 10, FIG. 9 is a schematic top view of a touch device in accordance with a third embodiment of the present disclosure, and FIG. 10 is a schematic sectional view of the touch device sectioned along a sectional line C-C' shown in FIG. 9. A touch device 300 has a substrate 310, on which at least a touch region 320 is defined. After forming a common layer 324 on the touch region 320 of the substrate 310, a piezoelectric material layer 326 is formed on the common layer 324 in succession. Then, plural rows of first sensing electrode patterns 342 and plural columns of second sensing electrode patterns 344 are formed on the piezoelectric material layer 326. Optimized, different rows of the first sensing electrode patterns 342 are mutually paralleled, and different columns of the second sensing electrode patterns 344 are mutually paralleled. In the third embodiment of the present disclosure, the touch device 300 further comprises a plurality of first connection lines 332 and a plurality of second connection lines 334, wherein the first connection lines 332 serially connect the first sensing electrode patterns 342 in the same rows to form a plurality of first sensing electrodes 352, and wherein the second connection lines 334 serially connect the second sensing electrode patterns 344 in the same columns to form a plurality of second sensing electrodes 354. The first sensing electrodes 352 may represent one way of position, such as X-axis direction, and the second sensing electrodes 354 may represent another way of position, such as Y-axis direction Besides, the touch device 300 further comprises a patterned insulation layer 330, wherein the insulation layer 330 is located between the first connection line 332 and the second connection line 334 to electrically insulate the first connection line 332 from the second connection line 334, thereby avoiding mutual conduction and interference between the first sensing electrodes 352 and the second sensing electrodes 354. Then, a plurality of signal wires 336 are formed and electrically connected with the first sensing electrodes 352 and the second sensing electrodes 354. Meanwhile, the signal wires 336 are electrically connected with a microprocessor (not shown) outside the touch region 320. Finally, a protection layer 340 is formed to cover the substrate 310 and protect the elements formed on the substrate 310, wherein materials of the first sensing electrode patterns 342 and the second sensing electrode patterns 344 in the present embodiment include various transparent or non-transparent conductive materials, which are same as the materials of the common layer 124 or the signal layer 128 in the first embodiment, so no more description is made herein. Materials of the first connection lines 332 and the second connection lines 334 can he selected from the above transparent or non-transparent conductive materials or further selected from metal materials, such as silver, copper or aluminum, such that the connection parts between the electrode patterns are not easily cracked.

In the third embodiment of the present disclosure, the common layer 324 and the piezoelectric material layer 326 is a continuous stacked structure, but not a patterned structure as disclosed in the first or second embodiment of the present disclosure. A sensing electrode layer is directly formed on a piezoelectric material layer 326, wherein the sensing electrode layer comprises a plurality of paralleled first sensing electrodes 352 along Y-axis direction and a plurality of paralleled second sensing electrodes 354 along X-axis direction. When a user touches the surface of the touch device 300, the piezoelectric material layer 326 near the touch point generates an electrical signal, and then the electrical signal is transmitted to the microprocessor outside the touch region by the first sensing electrodes 352 and the second sensing electrodes 354. After analysis, the microprocessor can determine the touch location. For the present disclosure, a touch module (sensing electrode layer) is directly formed on a piezoelectric material layer 326, so it can not only simplify the process but also effectively reduce thickness and weight of the overall elements.

In conclusion, the present disclosure provides a touch device, wherein the touch device comprises a plurality of piezoelectric transducers arranged in a touch region of a substrate, wherein the piezoelectric transducers are directly connected to an external microprocessor. When a user touches the touch device, each piezoelectric transducer transmits an electrical signal as an output signal to the microprocessor, and then the microprocessor can determine the user's touch point. Moreover, the piezoelectric transducer can directly convert mechanical vibration into the electrical signal such that the touch point occurred on the touch device can be detected without additional driving voltage, thereby providing an energy-saving touch device. In addition, the touch device of the present disclosure can not only detect touch actions occurred by conductors and non-conductors, but also can recognize multiple touches thereby solving defects existed in the known capacitive touch device.

While certain embodiments have been shown and described, various modifications and substitutions can be made thereto without departing from the spirit and scope of the disclosure. Therefore, it is to be understood that the present disclosure has been described by way of illustration and not limitations.

What is claimed is:

1. A touch device, comprising:
   a plurality of piezoelectric transducers arranged in a touch region of a substrate, wherein each of the plurality of piezoelectric transducers comprises a common layer, a signal layer, and a piezoelectric material layer located between the common layer and the signal layer, wherein the common layer is grounded, and wherein the signal layer comprises:
   a plurality of first sensing electrodes, wherein each first sensing electrode of the plurality of first sensing electrodes comprises a plurality of first sensing electrode patterns arranged on the piezoelectric material layer;
a plurality of first connection lines, wherein each first connection line of the plurality of first connection lines connects adjacent first sensing electrode patterns of the plurality of first sensing electrode patterns;
a plurality of second sensing electrodes, wherein each second sensing electrode of the plurality of second sensing electrodes comprises a plurality of second sensing electrode patterns arranged on the piezoelectric material layer; and
a plurality of second connection lines, wherein each second connection line of the plurality of second connection lines connects adjacent second sensing electrode patterns of the plurality of second sensing electrode patterns;
a plurality of insulation elements, wherein each of the plurality of insulation elements is located between adjacent piezoelectric transducers of the plurality of piezoelectric transducers; and
a plurality of signal wires electrically connecting the plurality of piezoelectric transducers, wherein each of the plurality of signal wires is located on a corresponding insulation element of the plurality of insulation elements.

2. The touch device as claimed in claim 1, wherein each piezoelectric transducer of the plurality of piezoelectric transducers is separated from each remaining piezoelectric transducer of the plurality of the piezoelectric transducers, and wherein the signal layer of each of the plurality of piezoelectric transducers is electrically connected with a corresponding signal wire of the plurality of signal wires.

3. The touch device as claimed in claim 1, wherein a first insulation element of the plurality of insulation elements is in contact with the piezoelectric material layer and the common layer of a first piezoelectric transducer of the plurality of piezoelectric transducers.

4. The touch device as claimed in claim 1, wherein the plurality of first sensing electrodes and the plurality of second sensing electrodes are arranged in a pattern.

5. The touch device as claimed in claim 1, further comprising an insulation layer located between the plurality of first connection lines and the plurality of second connection lines.

6. The touch device as claimed in claim 1, wherein the common layers of the plurality of piezoelectric transducers are integrally formed as a continuous structure.

7. The touch device as claimed in claim 6, wherein each of the insulation elements of the plurality of insulation elements is formed on the continuous structure.

8. The touch device as claimed in claim 1, wherein the common layers of the plurality of piezoelectric transducers are integrally formed as a first continuous structure, wherein the piezoelectric material layers of the plurality of piezoelectric transducers are integrally formed as a second continuous structure, wherein the second continuous structure is formed on the first continuous structure, and wherein the signal layers of the plurality of piezoelectric transducers are separately formed on the second continuous structure.

9. The touch device as claimed in claim 1, further comprising a protection layer covering the plurality of piezoelectric transducers.

10. The touch device as claimed in claim 1, wherein the piezoelectric material layer is made of one or more of zinc oxide (ZnO), lead zirconate titanate (PZT), lead lanthanum zirconate titanate (PLZT), barium titanate (BaTiO$_3$), polyvinylidene fluoride (PVDF), polyvinyl fluoride (PVF), polyvinylchloride (PVC) or quartz.

11. The touch device as claimed in claim 1, wherein the common layer is made of one or more of indium tin oxide (ITO), indium zinc oxide (IZO), cadmium tin oxide (CTO), aluminum zinc oxide (AZO), indium tin zinc oxide (ITZO), zinc oxide, cadmium oxide, hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO).

12. The touch device as claimed in claim 1, wherein the signal layer is made of one or more of indium tin oxide (ITO), indium zinc oxide (IZO), cadmium tin oxide (CTO), aluminum zinc oxide (AZO), indium tin zinc oxide (ITZO), tin oxide, zinc oxide, cadmium oxide, hafnium oxide (HfO), indium gallium zinc oxide (InGaZnO), indium gallium zinc magnesium oxide (InGaZnMgO), indium gallium magnesium oxide (InGaMgO) indium gallium aluminum oxide (InGaAlO), Carbon Nano Tube (CNT), Silver Carbon Nano Tube or Copper Carbon Nano Tube.

13. The touch device as claimed in claim 1, wherein one end of each of the plurality of signal wires is electrically connected to the signal layer of a corresponding piezoelectric transducer of the plurality of piezoelectric transducers and another end of each of the plurality of signal wires is electrically connected to a microprocessor.

14. The touch device as claimed in claim 1, wherein the plurality of signal wires and the plurality of piezoelectric transducers define a common surface.

15. The touch device as claimed in claim 1, wherein each of the plurality of signal wires has a portion overlying a top surface of the signal layer of at least one of the plurality of piezoelectric transducers.

16. A touch detection method of a touch device, comprising the following steps of:
detecting an output signal from a first piezoelectric transducer of a plurality of piezoelectric transducers of the touch device, wherein the output signal is converted from a mechanical vibration, wherein each of the plurality of piezoelectric transducers comprises a common layer, a signal layer, and a piezoelectric material layer located between the common layer and the signal layer, wherein the common layer is grounded, wherein the touch device further comprises a plurality of insulation elements and a plurality of signal wires electrically connecting the plurality of piezoelectric transducers, wherein each of the plurality of insulation elements is formed between adjacent piezoelectric transducers of the plurality of piezoelectric transducers, wherein each of the plurality of signal wires is formed on a corresponding insulation element of the plurality of insulation elements, and wherein the signal layer comprises:
a plurality of first sensing electrodes, wherein each first sensing electrode of the plurality of first sensing electrodes comprises a plurality of first sensing electrode patterns arranged on the piezoelectric material layer;
a plurality of first connection lines, wherein each first connection line of the plurality of first connection lines connects adjacent first sensing electrode patterns of the plurality of first sensing electrode patterns;
a plurality of second sensing electrodes, wherein each second sensing electrode of the plurality of second sensing electrodes comprises a plurality of second sensing electrode patterns arranged on the piezoelectric material layer; and a plurality of second connection lines, wherein each second connection line of the plurality of second connection lines connects adjacent second sensing electrode patterns of the plurality of second sensing electrode patterns; and determining if there is a touch point on the touch device at the first piezoelectric transducer according to the output signal.

17. The touch detection method as claimed in claim 16, wherein a potential difference is generated between the signal layer and the common layer of the first piezoelectric transducer when the first piezoelectric transducer is touched to form the output signal, and wherein the output signal is transmitted to an external microprocessor via a signal wire of the plurality of signal wires that is connected with the signal layer of the first piezoelectric transducer.

18. The touch detection method as claimed in claim 16, wherein the detecting comprises detecting an output signal from a second piezoelectric transducer, and the method further comprises:

defining coordinates of the first piezoelectric transducer and the second piezoelectric transducer;

calculating a barycentric coordinate according to the coordinates of the first piezoelectric transducer, the second piezoelectric transducer, the output signal from the first piezoelectric transducer and the output signal from the second piezoelectric transducer;

calculating a distance between the coordinates of the first piezoelectric transducer and the barycentric coordinate and a distance between the coordinates of the second piezoelectric transducer and the barycentric coordinate; and determining the touch point is at the first piezoelectric transducer based on the distance between the coordinates of the first piezoelectric transducer and the barycentric coordinate being shorter than the distance between the coordinates of the second piezoelectric transducer and the barycentric coordinate.

19. The touch detection method as claimed in claim 16, wherein the detecting comprises detecting an output signal from a second piezoelectric transducer, and the method further comprises:

comparing a value of the output signals from the first piezoelectric transducer to a value of the output signal from the second piezoelectric transducer; and determining the touch point is at the first piezoelectric transducer based upon the value of the output signal from the first piezoelectric transducer being larger than the value of the output signal from the second piezoelectric transducer.

20. The touch detection method as claimed in claim 16, further comprising an insulation layer located between the plurality of first connection lines and the plurality of second connection lines.

* * * * *